(12) United States Patent
Cho et al.

(10) Patent No.: US 11,815,544 B2
(45) Date of Patent: Nov. 14, 2023

(54) JIG FOR INSPECTION OF DISPLAY PANEL

(71) Applicant: SAMSUNG DISPLAY CO., LTD., Yongin-si (KR)

(72) Inventors: Hansu Cho, Hwaseong-si (KR); Junghun Sin, Seoul (KR); Keeyong Kim, Hwaseong-si (KR); Minhyeon Yu, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 235 days.

(21) Appl. No.: 17/327,890

(22) Filed: May 24, 2021

(65) Prior Publication Data

US 2022/0057431 A1 Feb. 24, 2022

(30) Foreign Application Priority Data

Aug. 24, 2020 (KR) ........................ 10-2020-0105894

(51) Int. Cl.
| | |
|---|---|
| *G01R 31/02* | (2006.01) |
| *G01N 21/95* | (2006.01) |
| *G02F 1/13* | (2006.01) |
| *B25B 11/00* | (2006.01) |
| *G01R 31/28* | (2006.01) |

(52) U.S. Cl.
CPC .......... *G01R 31/2825* (2013.01); *B25B 11/00* (2013.01); *G01N 2021/9513* (2013.01); *G01R 31/2865* (2013.01); *G02F 1/1309* (2013.01); *G02F 2203/69* (2013.01)

(58) Field of Classification Search
None
See application file for complete search history.

(56) References Cited

U.S. PATENT DOCUMENTS

| | | | |
|---|---|---|---|
| 2003/0027479 A1* | 2/2003 | Sawamori | H01J 9/42 445/63 |
| 2007/0152701 A1* | 7/2007 | Yoon | G01N 21/8803 356/237.5 |
| 2009/0116179 A1* | 5/2009 | Cho | H05K 5/02 361/679.01 |

(Continued)

FOREIGN PATENT DOCUMENTS

| | | |
|---|---|---|
| KR | 10-2011-0032016 | 3/2011 |
| KR | 10-1937747 | 1/2019 |
| KR | 10-2033886 | 10/2019 |

*Primary Examiner* — Ryan Crockett
(74) *Attorney, Agent, or Firm* — F. CHAU & ASSOCIATES, LLC

(57) ABSTRACT

A display panel inspection jig includes a stage comprising a seating area in which a display panel is to be disposed for inspection thereof, and a peripheral area surrounding the seating area, and comprising an uneven upper surface and a lower surface, the seating area of the stage being provided with an opening, a first supporter disposed on a first portion of the uneven upper surface of the stage, and a first barrier disposed on a second portion of the uneven upper surface of the stage. The first portion of the uneven upper surface being at the seating area and spaced apart from the opening, and the second portion of the uneven upper surface is at the peripheral area. The first barrier has an uneven lower surface such that the uneven lower surface of the first barrier and the uneven upper surface of the stage are fitted with each other.

20 Claims, 14 Drawing Sheets

(56) References Cited

U.S. PATENT DOCUMENTS

| | | | |
|---|---|---|---|
| 2009/0207352 A1* | 8/2009 | Moriyama | G09G 3/36 349/116 |
| 2010/0033191 A1* | 2/2010 | Lee | G01R 31/001 324/555 |
| 2012/0026315 A1* | 2/2012 | Lee | G09G 3/006 348/125 |
| 2012/0105092 A1* | 5/2012 | Abiru | G06F 3/047 324/760.01 |
| 2017/0186350 A1* | 6/2017 | Kim | G09G 3/006 |
| 2017/0219857 A1* | 8/2017 | Jiang | G01M 1/00 |
| 2018/0112974 A1* | 4/2018 | Ohyama | G01B 11/25 |
| 2019/0157991 A1* | 5/2019 | Arakawa | H10N 30/883 |

* cited by examiner

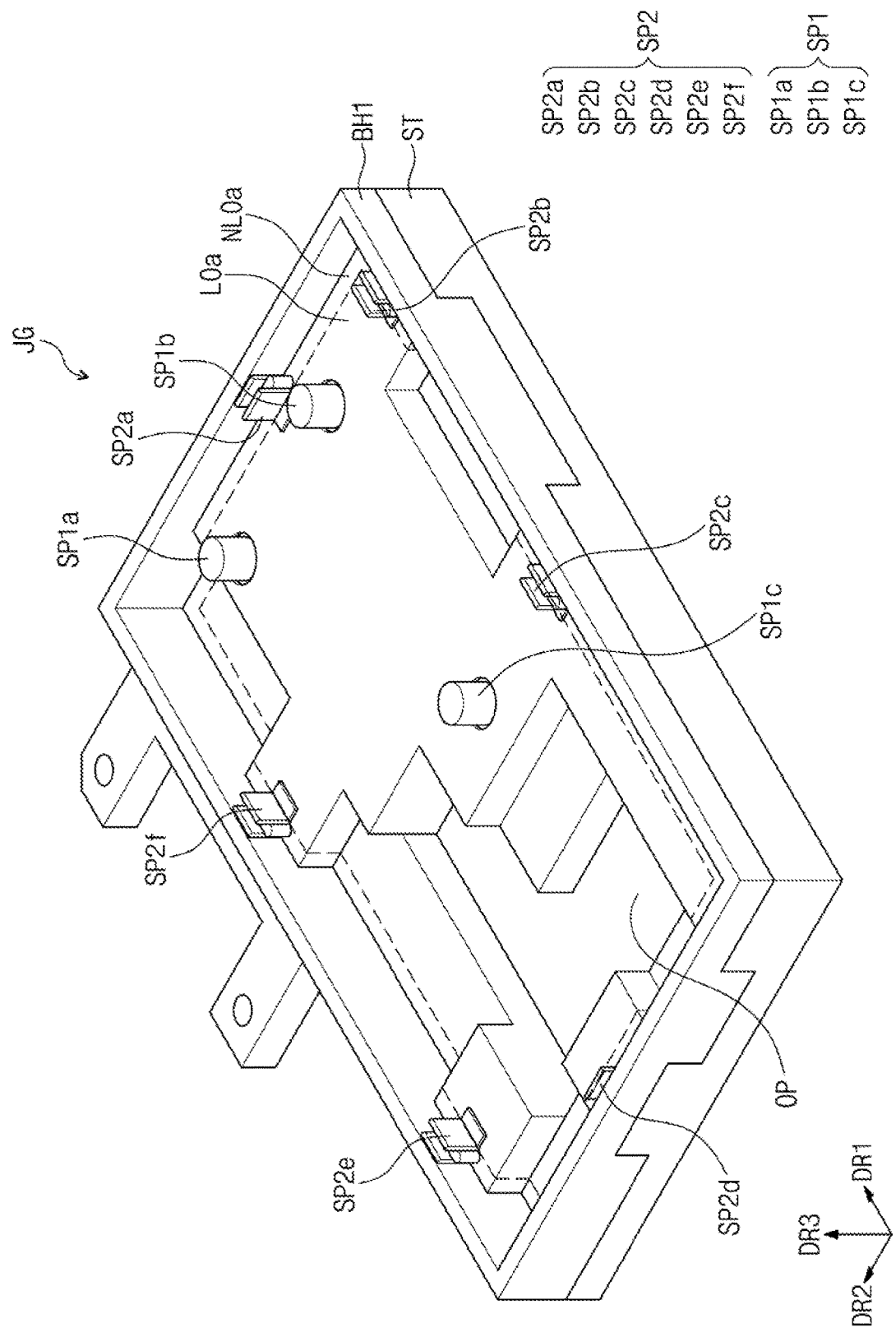

JIG FOR INSPECTION OF DISPLAY PANEL

CROSS-REFERENCE TO RELATED APPLICATION

This U.S. non-provisional patent application claims priority under 35 U.S.C. § 119 of Korean Patent Application No. 10-2020-0105894, filed on Aug. 24, 2020, the contents of which are hereby incorporated by reference in its entirety.

BACKGROUND

1. Field of Disclosure

The present invention relates to a jig for an inspection of a display panel, more particularly to, a jig for an inspection of a display panel including a light sensor.

2. Description of the Related Art

Multimedia devices, such as a television set, a mobile phone, a tablet computer, a notebook computer, a game unit, etc., provide a variety of functions, such as providing images to the user or detecting a user's input. Recently, electronic devices are also equipped with a function that detects a user's fingerprint. As a fingerprint detection method, there are various methods, such as an ultrasonic method that detects vibration, a capacitive method, and a light detection method.

For a device that includes a fingerprint sensor detecting the fingerprint using the light detection method, an inspection environment that minimizes the influence of the external light may be desirable in inspecting or evaluating the fingerprint sensor of the device.

SUMMARY

The present disclosure provides a jig capable of providing an environment in which an influence of an external light is reduced when a display panel including an light sensor is inspected.

According to an embodiment of the present invention, a display panel inspection jig includes a stage comprising a seating area in which a display panel is to be disposed for inspection thereof, and a peripheral area surrounding the seating area, and comprising an uneven upper surface and a lower surface, the seating area of the stage being provided with an opening extending from the uneven upper surface of the stage to the lower surface thereof, a first supporter disposed on a first portion of the uneven upper surface of the stage, the first portion of the uneven upper surface being at the seating area and spaced apart from the opening, and a first barrier disposed on a second portion of the uneven upper surface of the stage. The second portion of the uneven upper surface is at the peripheral area. The first barrier has an uneven lower surface such that the uneven lower surface of the first barrier and the uneven upper surface of the stage are fitted with each other.

An upper surface of the first supporter is disposed at a first height from the lower surface of the stage. An upper surface of the first barrier is disposed at a second height from the lower surface of the stage, and the second height is equal to or greater than the first height. The lower surface of the stage is flat.

The first barrier has a height that varies along the peripheral area.

The first barrier is spaced apart from the display panel disposed on the first supporter by a predetermined distance, when the display panel inspection jig is viewed in a plan view. The predetermined distance is equal to or smaller than about 3 mm.

The first barrier comprises a first sub-barrier extending lengthwise in a first direction, a second sub-barrier extending lengthwise in a second direction, different from the first direction, and connected to a first end of the first sub-barrier, and a third sub-barrier extending lengthwise in the second direction and connected to a second end of the first sub-barrier, and spaced apart from the second sub-barrier in the first direction.

The first barrier further comprises a fourth sub-barrier extending lengthwise in the first direction and spaced apart from the first sub-barrier in the second direction.

The seating area is interposed between the first sub-barrier and the fourth sub-barrier.

The first barrier is integrally formed with the stage.

The display panel inspection jig further includes a second barrier disposed on a third portion of the uneven upper surface at the seating area of the stage. When the display panel is viewed in a plan view, the second barrier is spaced apart from the first supporter and the first barrier.

An upper surface of the first supporter is disposed at a first height from the lower surface of the stage, an upper surface of the second barrier is disposed at a second height from the lower surface of the stage, the second height is equal to or smaller than the first height, and the lower surface of the stage is flat.

A difference between the first height and the second height is equal to or smaller than about 0.2 mm.

The second barrier includes a first auxiliary barrier disposed adjacent to the opening of the stage, a second auxiliary barrier connected to a first end of the first auxiliary barrier and extending away from the opening of the stage, and a third auxiliary barrier connected to a second end of the first auxiliary barrier and extending away from the opening of the stage. The second auxiliary barrier and the third auxiliary barrier are spaced apart from each other in a direction in which the first auxiliary barrier extends.

The second barrier further includes a fourth auxiliary barrier spaced apart from the first auxiliary barrier in the direction in which each of the second auxiliary barrier and the third auxiliary barrier extends away from the opening of the stage. The second auxiliary barrier is connected to a first end of the fourth auxiliary barrier, and the third auxiliary barrier is connected to a second end of the fourth auxiliary barrier. When the display panel inspection jig is viewed in a plan view, the second barrier is spaced apart from the opening and forms a closed line.

The second barrier is integrally formed with the stage.

The display panel inspection jig further includes a second supporter disposed in the seating area of the stage and supporting the display panel. The second supporter is adjacent to a corresponding portion of the first barrier, and the second support extends parallel to a direction in which the corresponding portion of the first barrier extends.

The second supporter supports a side surface or a lower surface of the display panel.

According to an embodiment of the present invention, a display panel inspection jig includes a stage comprising a seating area in which a display panel is to be disposed in inspection thereof and a peripheral area surrounding the seating area, the seating area of the stage being provided with an opening defined therethrough, a first supporter disposed on the seating area of the stage and supporting a lower surface of the display panel, a second supporter disposed on the seating area of the stage, spaced apart from the first supporter, and supporting an edge of the display panel, and a first barrier disposed on the peripheral area of the stage and surrounding the seating area.

The display panel inspection jig further includes a second barrier disposed in the seating area, spaced apart from the opening of the stage, and forming, when the display panel inspection jig is viewed in a plan view, a closed line.

When the display panel inspection jig is viewed in the plan view, the closed line is spaced apart from the first supporter.

The second barrier is adjacent to a corresponding portion of the first barrier, and the second barrier extends parallel to a direction in which the corresponding portion of the first barrier extends.

According to the above, the display panel inspection jig provides an environment in which the influence of external light is minimized in a process of inspecting the display panel, and thus, a noise is reduced in a result value of the inspection.

BRIEF DESCRIPTION OF THE DRAWINGS

The above and other advantages of the present disclosure will become readily apparent by reference to the following detailed description when considered in conjunction with the accompanying drawings wherein:

FIG. 9 is a perspective view showing a display panel inspection jig according to an embodiment of the present disclosure;

DETAILED DESCRIPTION

Figure 1A:
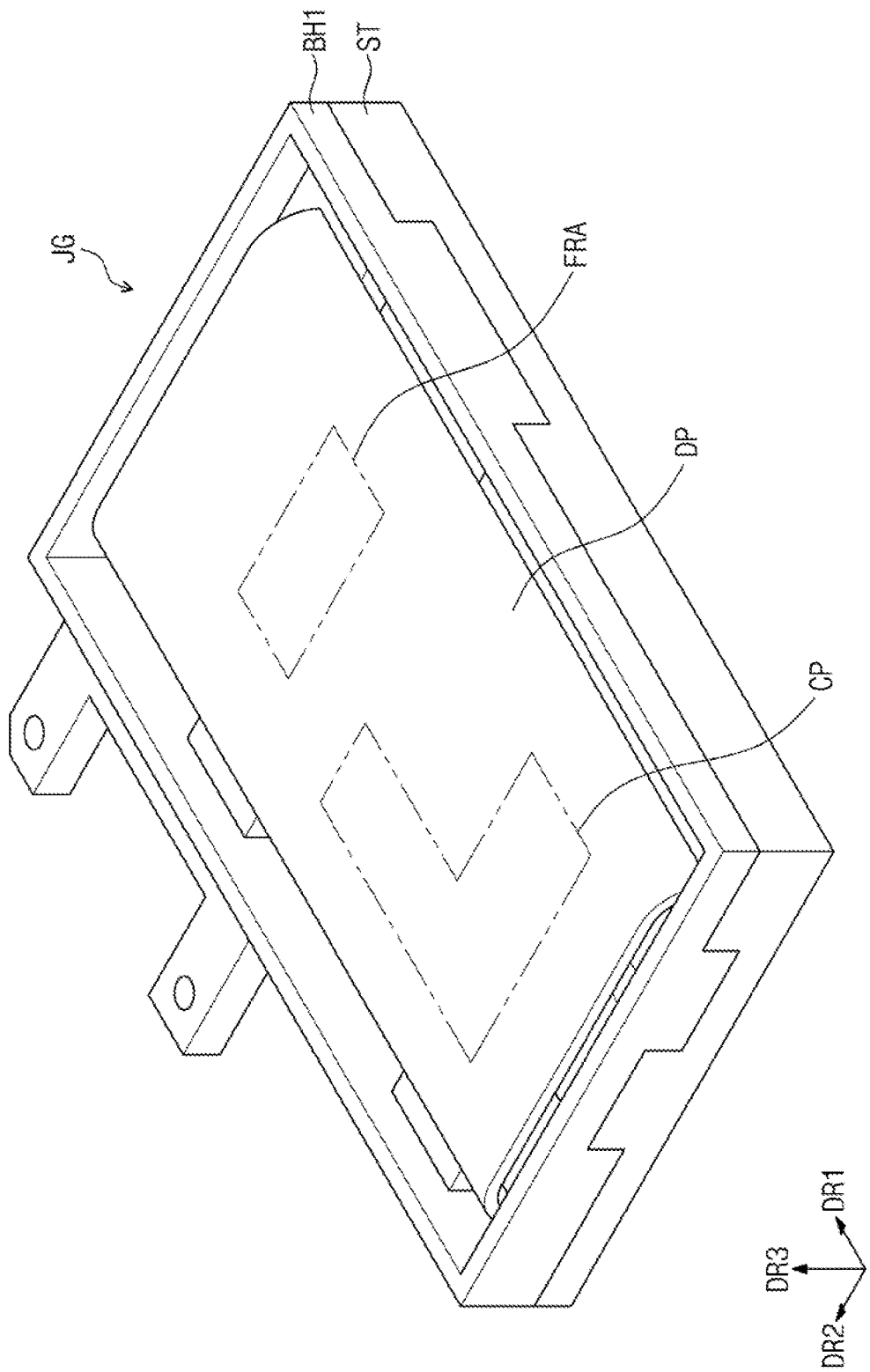
FIG. 1A is a perspective view showing a display panel inspection jig, which is provided with the display panel placed thereon according to an embodiment of the present disclosure.

The present disclosure may be variously modified and realized in many different forms, and thus specific embodiments will be exemplified in the drawings and described in detail hereinbelow. However, the present disclosure should not be limited to the specific disclosed forms, and be construed to include all modifications, equivalents, or replacements included in the spirit and scope of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as shown in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present disclosure will be explained in detail with reference to the accompanying drawings.

FIGS. 1A to 11 show a display panel inspection jig according to an embodiment, and a shape of the display panel inspection jig should not be limited to those shown in FIGS. 1A to 11. Hereinafter, the display panel inspection jig of the present disclosure will be described with reference to the shown embodiments. In the present disclosure, the display panel inspection jig may be referred to as an "inspection jig" or a "jig".

Figure 1B:
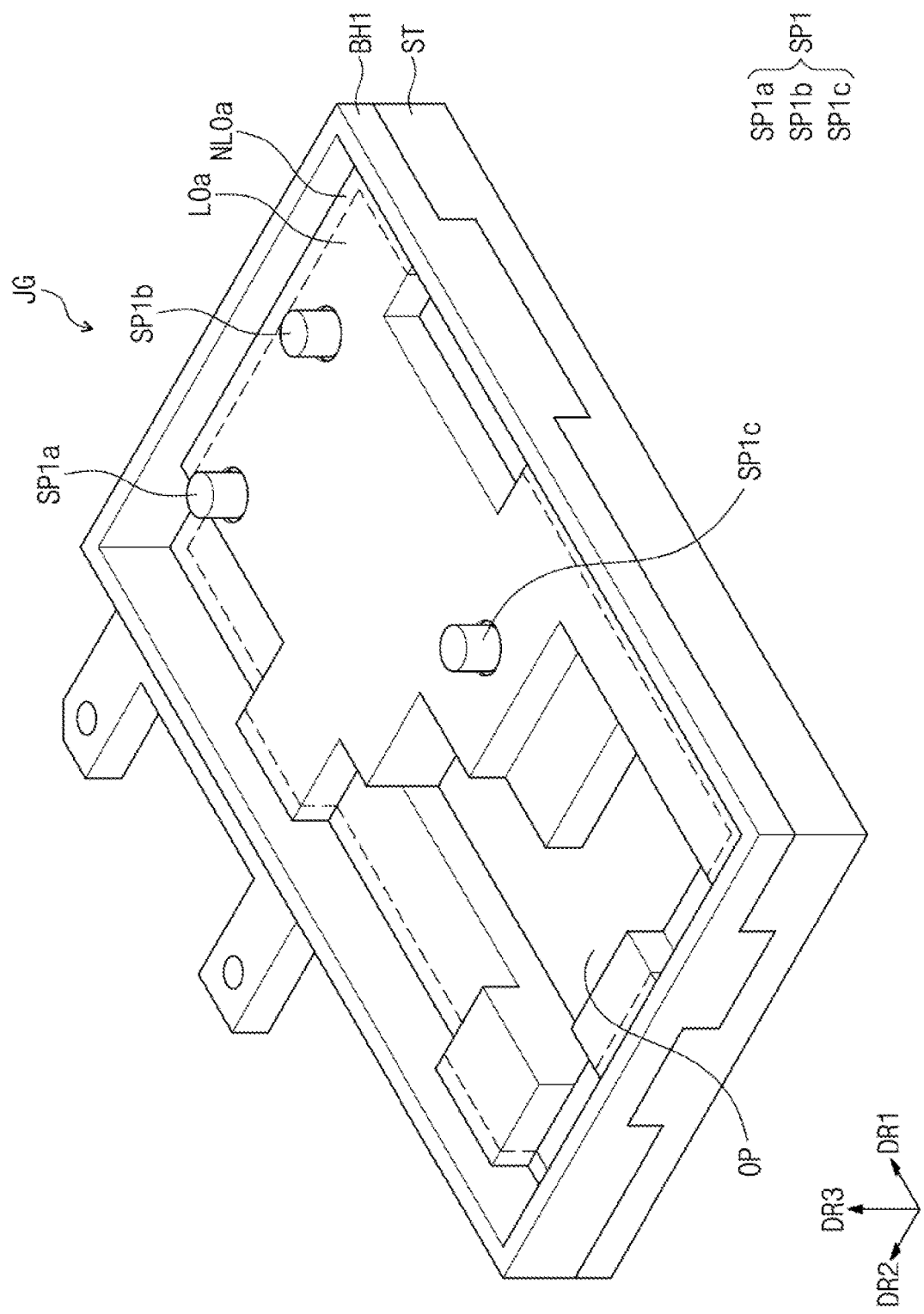
FIG. 1B is a perspective view showing a display panel inspection jig according to an embodiment of the present disclosure.
Figure 2:
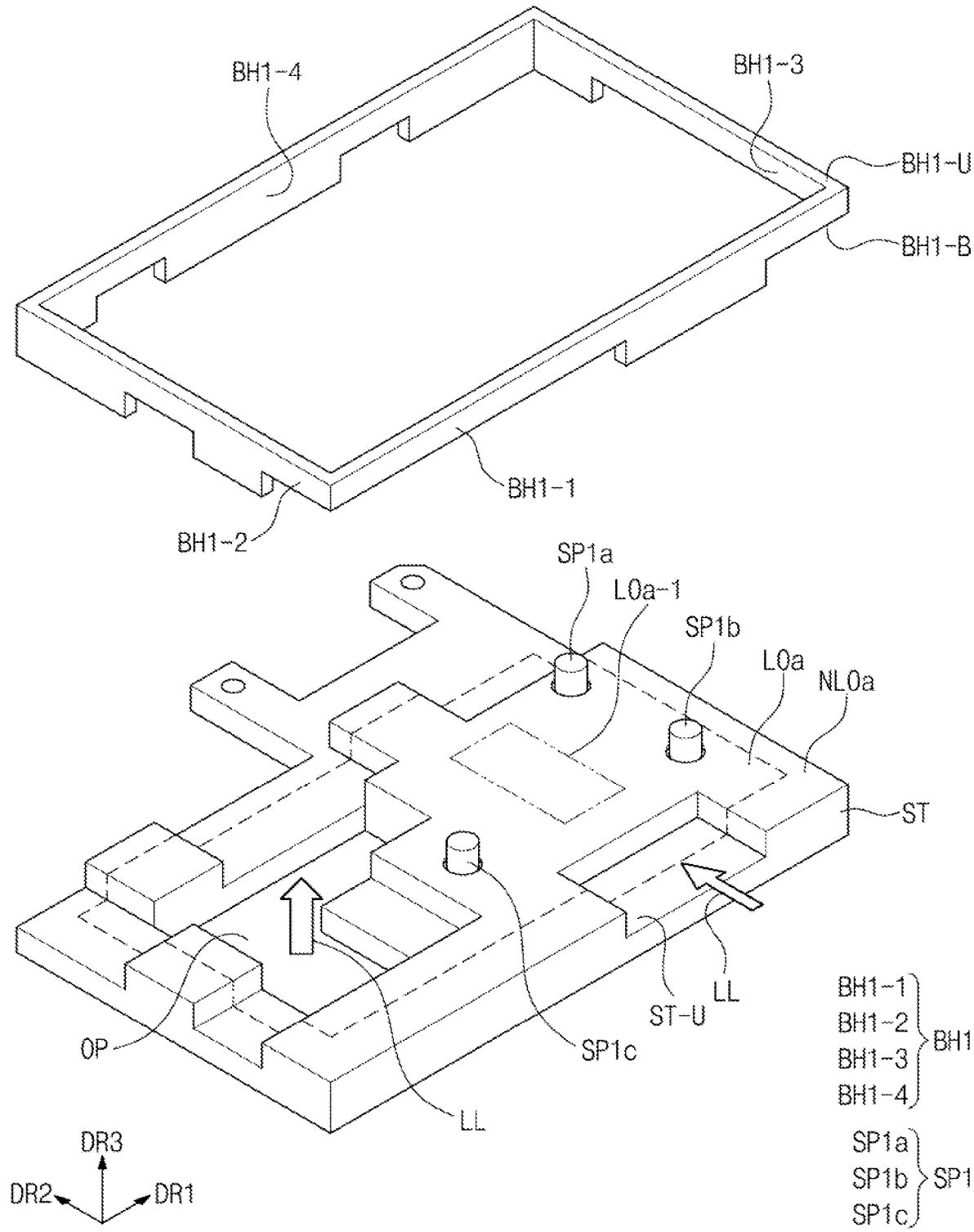
FIG. 2 is an exploded perspective view showing a display panel inspection jig according to an embodiment of the present disclosure.
Figure 3:
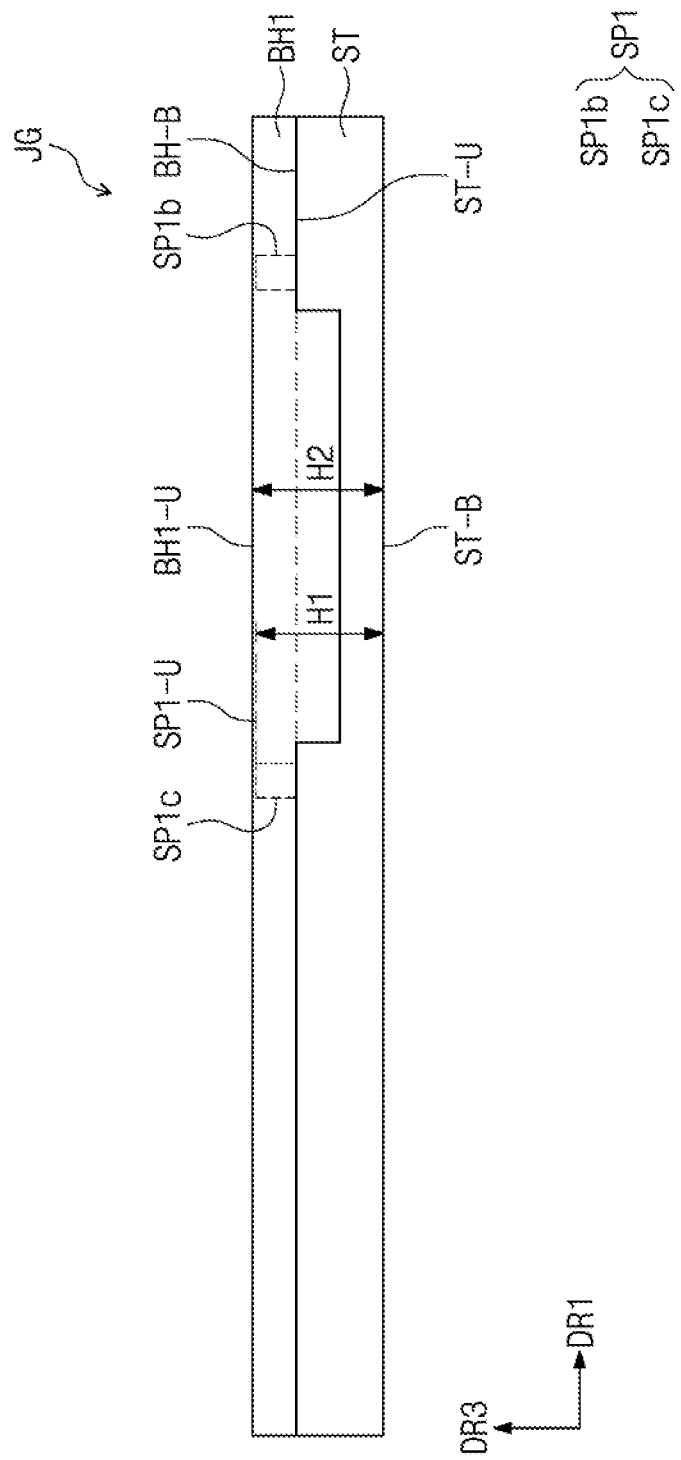
FIG. 3 is a side view showing a display panel inspection jig according to an embodiment of the present disclosure.
Figure 4:
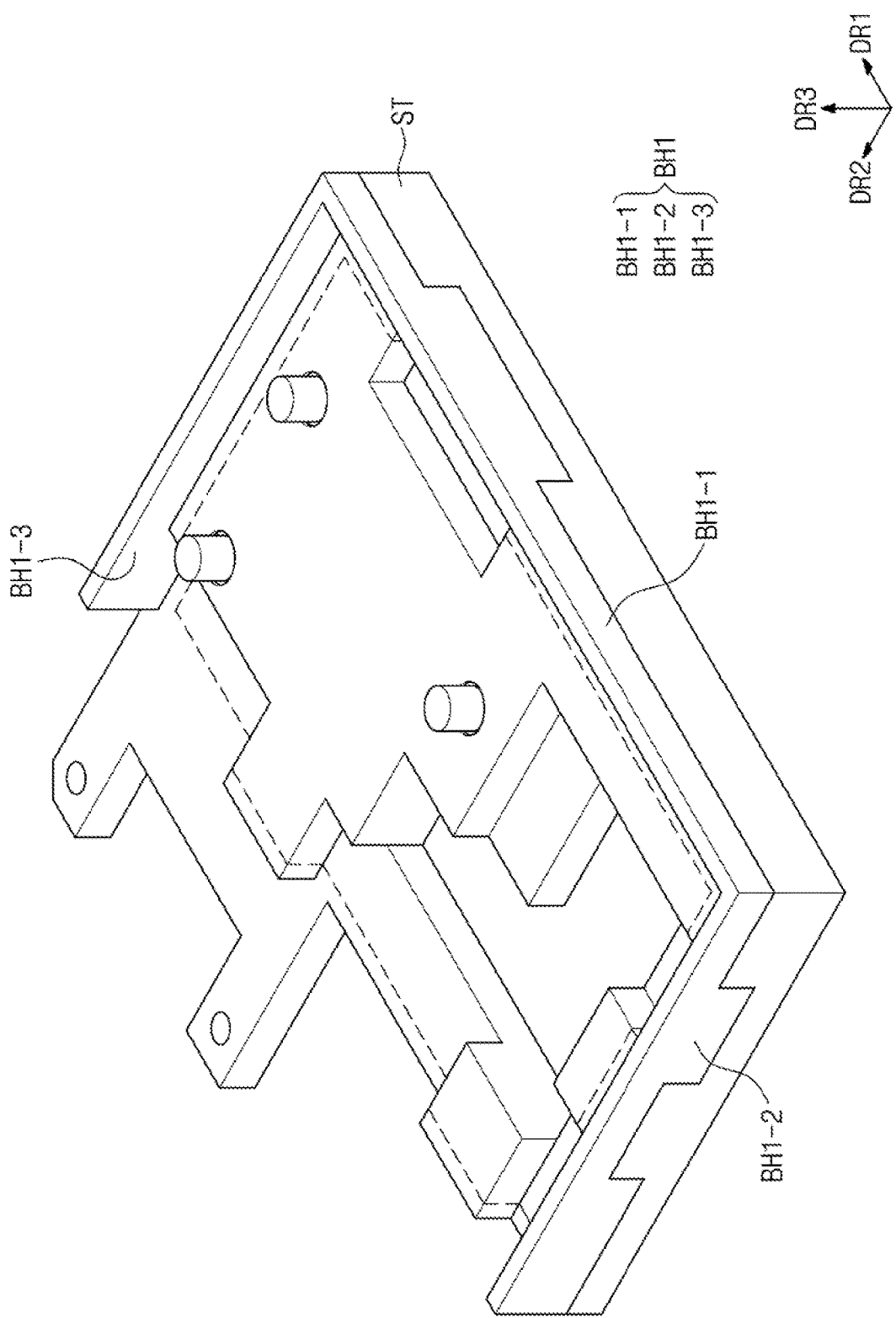
FIG. 4 is a perspective view showing a display panel inspection jig according to an embodiment of the present disclosure.

FIGS. 1A, 1B, 2, 3, and 4 show the jig according to an embodiment. FIG. 1A is a perspective view showing a jig on which a display panel DP is placed according to an embodiment of the present disclosure. FIG. 1B is a perspective view showing the jig from which the display panel DP is removed. FIG. 2 is an exploded perspective view showing the jig of FIG. 1B. FIG. 3 is a side view showing the jig according to an embodiment. FIG. 4 is a perspective view showing a jig having a different structure from that of the jig shown in FIG. 1B.

Meanwhile, front (or upper) and rear (or lower) surfaces of each member are defined with respect to a plane substantially parallel to each of a first direction DR1 and a second direction DR2. The front and rear surfaces are opposite to each other in a third direction DR3, and a normal line direction of each of the front and rear surfaces may be substantially parallel to the third direction DR3.

A separation distance between the front surface and the rear surface in the third direction DR3 may correspond to a thickness/height of each member. Meanwhile, directions indicated by the first, second, and third directions DR1, DR2, and DR3 may be relative to each other and may be changed to other directions. Hereinafter, the directions indicated by the first, second, and third directions DR1, DR2, and DR3 are referred to using the same reference numerals as those of the first, second, and third directions DR1, DR2, and DR3.

Referring to FIG. 1A, the display panel DP may be a device that is activated in response to electrical signals to provide an image to a user. The display panel DP may be applied to various electronic devices, such as a tablet computer, a notebook computer, or a smartphone, to provide the image to the user.

The jig JG of the present disclosure may be used to inspect the display panel DP including a light detection sensor (or light sensor). The light detection sensor may be a sensor that receives a light incident thereto and generates an electrical signal. For example, the display panel DP of the present exemplary embodiment may include an optical fingerprint sensor. The optical fingerprint sensor may sense the light which is reflected from a finger touching the display panel and is incident thereto using the light detection sensor. The fingerprint sensor may acquire an image of a fingerprint and may detect a user's fingerprint according to a difference in surface uniformity or curved shape of the fingerprint.

An area included in the display panel DP and overlapping the fingerprint sensor may be referred to as a fingerprint sensor area FRA. The fingerprint may be sensed in the fingerprint sensor area FRA, and substantially the image may also be provided to the display panel DP through the fingerprint sensor area FRA.

The display panel DP may include a circuit board. The circuit board may receive the electrical signals or may provide the electrical signals to elements included in the display panel DP. For example, the circuit board may receive information on the image to be displayed in the display panel DP and the sensed user's fingerprint. An area included in the display panel DP and overlapping the circuit board may be referred to as a circuit board area CP.

Meanwhile, a process of inspecting the fingerprint sensor included in the display panel DP may include processes of combining and calibrating images acquired from a dark condition and a bright condition. In this case, when the fingerprint sensor is exposed to an external light in the process of acquiring the image, the inspection result may include a noise.

Accordingly, the process of inspecting the fingerprint sensor may require a darkroom environment or an environment similar to the darkroom environment. However, a driving evaluation process of the display panel DP may include other inspections in addition to the inspection of the fingerprint sensor. The driving evaluation process of the display panel DP may be performed in an open environment facility, and there is a problem that it is difficult to have a darkroom environment.

The jig JG of the present disclosure may provide the environment similar to the darkroom environment during the inspection of the display panel DP placed on the jig JG. Accordingly, the noise of the inspection result of the fingerprint sensor may be reduced.

Referring to FIGS. 1A and 1B, the jig JG may include a stage ST, a first supporter SP1, and a first barrier BH1. The first barrier BH1 and the first supporter SP1 may be disposed on the stage ST to be spaced apart from each other.

The stage ST may include a seating area LOa where the display panel DP to be inspected is seated and a peripheral area NLOa surrounding the seating area LOa. The seating area LOa may have a shape of the display panel DP seated therein. The peripheral area NLOa may include a coupling portion to allow the jig JG to be coupled to another inspection equipment.

The fingerprint sensor and the circuit board, which are included in the display panel DP, may be seated to face an upper surface of the stage ST of the jig JG in the third direction DR3. The fingerprint sensor and the circuit board, which are included in the display panel DP, may be disposed on the upper surface of the stage ST of the jig JG.

The stage ST may be provided with an opening OP overlapping a region defined by an outer boundary of the seating area LOa. For example, the seating area LOa of the stage ST may be provided with the opening OP. When the display panel DP is seated on the jig JG, the opening OP may overlap the circuit board area CP of the display panel DP. The circuit board of the display panel DP may be exposed to the outside of a lower surface of the stage ST through the opening OP. The driving evaluation on the circuit board may be performed through the opening OP of the jig JG when the display panel DP is seated on the jig JG. The shape of the opening OP is not limited to that shown in FIG. 1B, and the shape of the opening OP may have the shape of the circuit board of the display panel DP.

When the display panel DP is seated on the jig JG, the fingerprint sensor area FRA of the display panel DP may not overlap the opening OP. Since the fingerprint sensor is sensitive to light exposure, the fingerprint sensor area FRA and the fingerprint sensor of the display panel DP may be covered by the lower surface of the stage ST.

Referring to FIG. 2, the stage ST may include an upper surface ST-U, and the upper surface ST-U may be an uneven upper surface. Portions of the upper surface ST-U of the stage ST may be protruded, and the other portions of the upper surface ST-U of the stage ST may be recessed. Accordingly, a thickness of the stage ST in the third direction DR3 may vary depending on its position in the stage ST.

When the display panel DP is disposed on the stage ST, an external light LL may be incident to a lower surface of the display panel DP via the opening OP and a side surface of the display panel DP due to the uneven upper surface ST-U of the stage ST. The external light LL incident to the display panel DP, if arriving at the fingerprint sensor area FRA, may cause a noise on a result value in the inspection process of the fingerprint sensor. In an embodiment, to prevent the external light LL from arriving at the finger sensor area FRA in the inspection of the display panel DP, the BH1 may serve to block the external light LL from arriving at the fingerprint sensor area FRA.

The first supporter SP1 may overlap the seating area LOa and may be disposed on the stage ST. The first supporter SP1 may be spaced apart from the opening OP and a portion LOa-1 of the seating area LOa overlapping the fingerprint sensor area FRA by a predetermined distance when the jig JG is viewed in a plan view. When the display panel DP is placed in the jig JG for inspection, the first supporter SP1 may be in contact with the lower surface of the display panel DP to support the display panel DP. In a case where the first supporter SP1 overlaps the fingerprint sensor area FRA, the first supporter SP1 may be in contact with the fingerprint sensor and may exert an influence on the inspection result.

The first supporter SP1 may include a plurality of supporters SP1a, SP1b, and SP1c that support the lower surface of the display panel DP as shown in FIG. 2. Each of the supporters SP1a, SP1b, and SP1c may be spaced apart from the portion LOa-1 of the seating area LOa overlapping the fingerprint sensor area FRA. Each of the supporters SP1a, SP1b, and SP1c may be disposed on the upper surface ST-U of the stage ST, and may extend in the third direction DR3 from the upper surface ST-U. However, the first supporter SP1 should not be limited thereto or thereby, and the first supporter SP1 may include a single supporter that supports the lower surface of the display panel DP.

The first supporter SP1 may include a plastic or metal material. In addition, since the first supporter SP1 may be in contact with the lower surface of the display panel DP, the first supporter SP1 may include an elastic material such as rubber to prevent the display panel DP from being damaged. The first supporter SP1 may be formed of a variety of materials having a strength enough to support the display panel DP, without being limited to a particular material.

The first supporter SP1 may define a separation space between the lower surface of the display panel DP and the upper surface ST-U of the stage ST. The external light LL which is incident to the lower surface of the display panel DP through the opening OP may arrive at the fingerprint sensor area FRA through the separation space, and the inspection result of the fingerprint sensor may be influenced by the external light LL.

In an embodiment, the fingerprint sensor area FRA and the opening OP may be spaced apart from each other to the extent that the external light LL illuminated via the opening OP rarely arrives at the fingerprint sensor area FRA. In an embodiment, the upper surface ST-U of the stage ST may be provided with a stepped boundary region between the opening OP and the fingerprint sensor area FRA, and the stepped boundary region may serve to prevent the external light LL reflected from the lower surface of the display panel DP from arriving at the fingerprint sensor area FRA.

The first barrier BH1 may overlap the peripheral area NLOa and may be disposed on the stage ST. The first barrier BH1 may surround all or a portion of the seating area LOa. The first barrier BH1 may block the external light LL incident to the side surface of the display panel DP disposed on the stage ST.

The first barrier BH1 may include an uneven lower surface BH1-B corresponding to the uneven upper surface ST-U of the stage ST on which the first barrier BH1 is disposed. For example, when the upper surface ST-U of the stage ST has a protruded shape, the lower surface BH1-B of the first barrier BH1 may have a recessed shape corresponding to the protruded shape of the of the upper surface ST-U of the stage ST. As the shape of the lower surface BH1-B of the first barrier BH1 corresponds to the shape of the upper surface ST-U of the stage ST, the first barrier BH1 may block the external light LL passing through between the first barrier BH1 and the stage ST. When the first barrier BH1 and the stage ST are coupled to each other for inspection, the uneven lower surface BH1-B of the first barrier BH1 and the uneven upper surface of the ST-U of the stage ST may be fitted with each other so that no gap therebetween exists, thereby preventing the external light LL from arriving at the fingerprint sensor area FRA.

An upper surface BH1-U of the first barrier BH1 may be flat. Accordingly, a height of the first barrier BH1 in the third direction DR3 may vary depending on the peripheral area NLOa. That is, the height between the lower surface BH1-B of the first barrier BH1 and the upper surface BH1-U of the first barrier BH1 may vary along the peripheral area NLOa.

Referring to FIG. 3, the upper surface ST-U of the stage ST may be uneven when viewed in a side view, and the lower surface BH1-B of the first barrier BH1 may have a shape corresponding to the shape of the upper surface ST-U of the stage ST. Accordingly, a height of a coupled structure of the stage ST and the first barrier BH1 may be constant. For example, a lower surface of the stage ST and an upper surface of the first barrier BH1 may be flat, and a distance therebetween may be constant.

Meanwhile, in the specification, the phrase "when viewed in a side view" means when an object portion is viewed toward the side thereof, for example, in the first direction DR1 or the second direction DR2. FIG. 3 shows the jig JG viewed toward the side thereof from the second direction DR2.

In FIG. 3, for the convenience of explanation, supporters SP1b and SP1c of the first support SP1 overlapping the first barrier BH1 in the side view are indicated by a dotted line. The height between the lower surface ST-B of the stage ST and an upper surface SP1-U of the first supporter SP1 may be referred to as a first height H1. The height between the lower surface ST-B of the stage ST and the upper surface BH1-U of the first barrier BH1 may be referred to as a second height H2.

The second height H2 may be equal to or greater than the first height H1. Accordingly, the separation space may be covered by the first barrier BH1 in a side view, and the first barrier BH1 may block the external light LL incident to the side surface of the jig JG.

Referring to FIGS. 2 and 4, the first barrier BH1 may include a plurality of sub-barriers extending in the same or different directions. FIGS. 2 and 4 show first barriers BH1 having different shapes from each other.

Referring to FIG. 4, the first barrier BH1 may include first, second, and third sub-barriers BH1-1, BH1-2, and BH1-3. The first barrier BH1, however, is not limited thereto or thereby. As shown in FIG. 2, the first barrier BH1 may further include a fourth sub-barrier BH1-4 compared to that of FIG. 4.

In FIG. 2, the plurality of sub barriers BH1-1, BH1-2, BH1-3, and BH1-4 may surround the seating area LOa. In FIG. 4, the plurality of sub barriers BH1-1, BH1-2, BH1-3 may partially surround a portion of the seating area LOa.

The first sub-barrier BH1-1 may extend lengthwise in the first direction DR1. The first sub-barrier BH1-1 may block the external light incident to an outer side surface of the first sub-barrier BH1-1 in the second direction DR2.

The second sub-barrier BH1-2 may extend lengthwise in the second direction DR2. The second sub-barrier BH1-2 may be adjacent to one side of the first sub-barrier BH1-1. The second sub-barrier BH1-2 may block the external light incident to an outer side surface of the second sub-barrier BH1-2 in the first direction DR1.

The third sub-barrier BH1-3 may extend lengthwise in the second direction DR2. The third sub-barrier BH1-3 may be adjacent to the other side of the first sub-barrier BH1-1. The third sub-barrier BH1-3 may be spaced apart from the second sub-barrier BH1-2 with the seating area LOa interposed therebetween. The third sub-barrier BH1-3 may be spaced apart from the second sub-barrier BH1-2 in the first direction DR1 and may face the second sub-barrier BH1-2. The third sub-barrier BH1-3 may block the external light incident to an outer side surface of the third sub-barrier BH1-3 in a direction opposite to the first direction DR1.

The fourth sub-barrier BH1-4 may extend lengthwise in the first direction DR1. The fourth sub-barrier BH1-4 may be spaced apart from the first sub-barrier BH1-1 with the seating area LOa interposed therebetween. The fourth sub-barrier BH1-4 may be spaced apart from the first sub-barrier BH1-1 in the second direction DR2 and may face the first sub-barrier BH1-1. The fourth sub-barrier BH1-4 may block the external light incident to an outer side surface of the fourth sub-barrier BH1-4 in a direction opposite to the second direction DR2.

As shown in FIG. 2, the first, second, third, and fourth sub-barriers BH1-1, BH1-2, BH1-3, and BH1-4 may be connected to each other to surround the seating area LOa. Accordingly, the first, second, third, and fourth sub-barriers BH1-1, BH1-2, BH1-3, and BH1-4 may form a closed line when the jig JG is viewed in a plan view.

Meanwhile, in the specification, the phrase "when viewed in a plan view" means when an object portion is viewed from above and when an object portion is viewed from the third direction DR3.

As shown in FIG. 4, the second and third sub-barriers BH1-2 and BH1-3 may be respectively connected to one side and the other side of the first sub-barrier BH1-1. Therefore, the first, second, and third sub-barriers BH1-1, BH1-2, and BH1-3 may surround three sides of the seating area LOa.

FIG. 4 shows the first barrier BH1 including the first sub-barrier BH1-1 extending lengthwise in the first direction DR1 and the second and third sub-barriers BH1-2 and BH1-3 extending lengthwise in the second direction DR2. The present invention, however, is not limited thereto. For example, the shape of the first barrier BH1 may include a first sub-barrier BH1-1 extending lengthwise in the second direction DR2, and the second and third sub-barriers BH1-2 and BH1-3 extending lengthwise in the first direction DR1.

The sub-barriers BH1-1, BH1-2, BH1-3, and BH1-4 may be integrally formed with each other. Accordingly, the sub-barriers BH1-1, BH1-2, BH1-3, and BH1-4 may have a single frame shape, however, they should not be limited thereto or thereby. The sub-barriers BH1-1, BH1-2, BH1-3, and BH1-4 may be separated from each other, or only some sub-barriers of the sub-barriers BH1-1, BH1-2, BH1-3, and BH1-4 may be connected to each other.

In FIGS. 2 and 4, the sub-barriers BH1-1, BH1-2, BH1-3, and BH1-4 have the same width as each other when viewed in a plane, however, they should not be limited thereto or thereby. As an example, some of the sub-barriers BH1-1, BH1-2, BH1-3, and BH1-4 may have the same width as each other or all of the sub-barriers BH1-1, BH1-2, BH1-3, and BH1-4 may have different widths from each other.

The first barrier BH1 described with reference to FIGS. 1A to 4 may be integrally formed with the stage ST. The first barrier BH1 may include the same material as that of the stage ST, however, it should not be limited thereto or thereby. As another way, the first barrier BH1 may be separated from the stage ST and may include a material different from that of the stage ST.

FIGS. 5 to 8 show a display panel inspection jigs JG according to an embodiment of the present disclosure. The jig shown in FIGS. 5 to 8 may have substantially the same configurations as those of FIGS. 1A to 4 except some components. Hereinafter, different features from those of FIGS. 1A to 4 will be mainly described with reference to FIGS. 5 to 8.

Referring to FIGS. 5 to 8, the jig JG according to the embodiment may further include a second barrier BH2. The second barrier BH2 may be disposed on the stage ST to overlap the seating area LOa. The second barrier BH2 may be spaced apart from the first supporter SP1 and the first barrier BH1.

The second barrier BH2 may be disposed to overlap or to be adjacent to the fingerprint sensor area FRA (refer to FIG. 1A). The second barrier BH2 may block the external light incident to the fingerprint sensor area FRA (refer to FIG. 1A).

Figure 5:
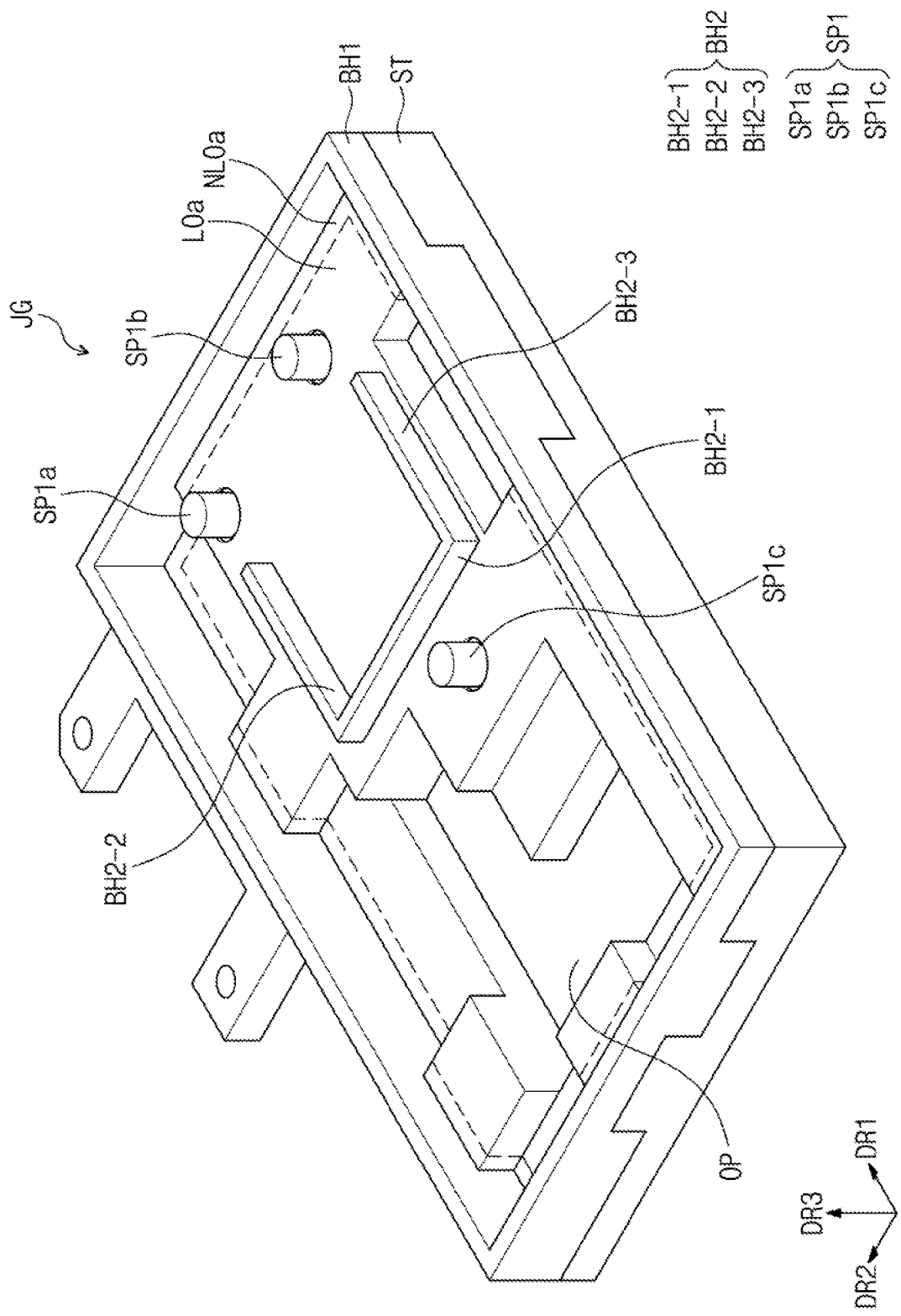
FIG. 5 is a perspective view showing a display panel inspection jig according to an embodiment of the present disclosure.
Figure 6:
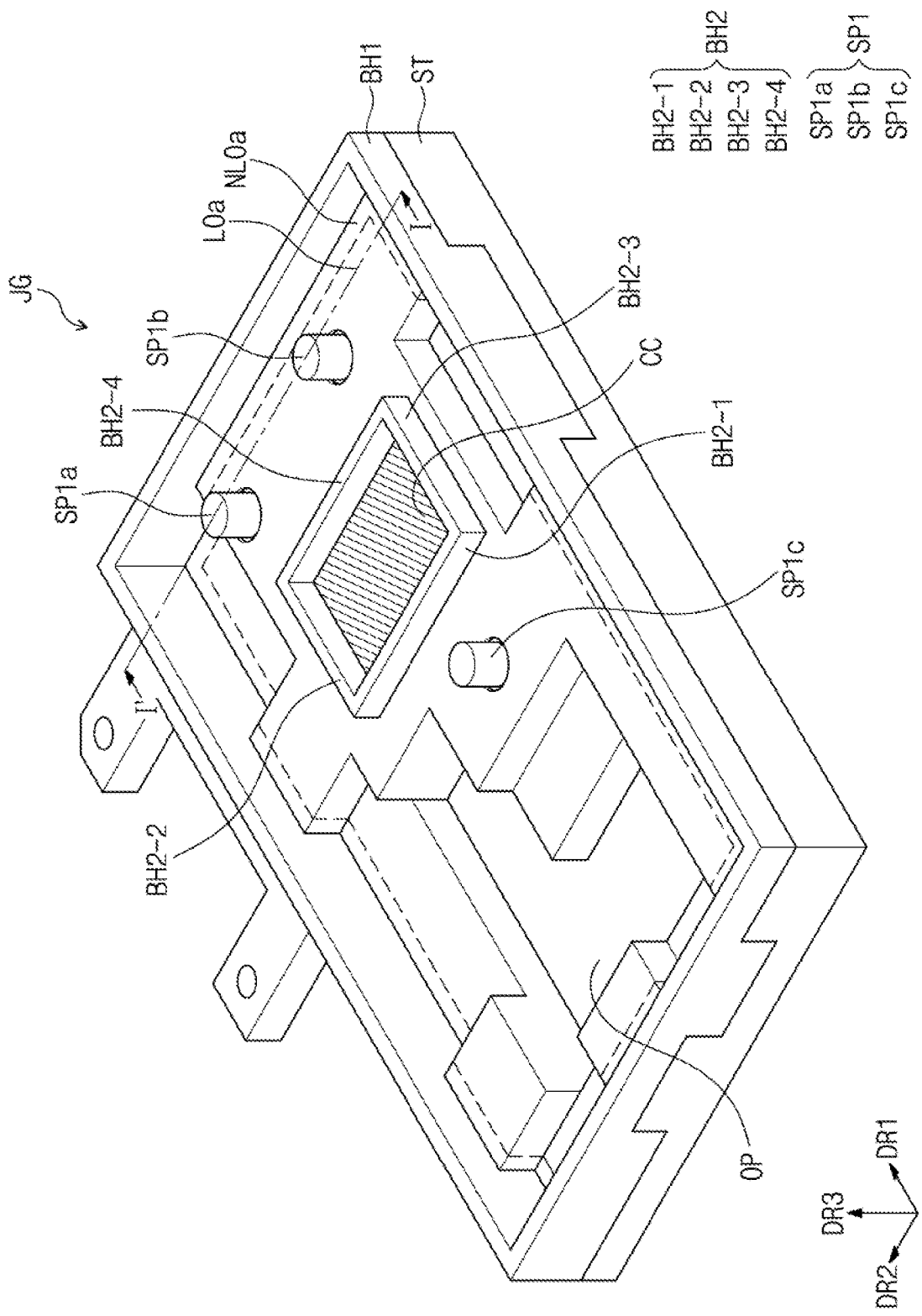
FIG. 6 is a perspective view showing a display panel inspection jig according to an embodiment of the present disclosure.

The jigs JG respectively shown in FIGS. 5 and 6 may have substantially the same configurations as each other except a shape of the second barrier BH2. Referring to FIGS. 5 and 6, the second barrier BH2 may include a plurality of auxiliary barriers BH2-1, BH2-2, BH2-3, and BH2-4 extending in the same or different directions.

Referring to FIG. 5, the second barrier BH2 may include first, second, and third auxiliary barriers BH2-1, BH2-2, and BH2-3, however, it should not be limited thereto or thereby. As shown in FIG. 6, the second barrier BH2 may further include a fourth auxiliary barrier BH2-4.

The first auxiliary barrier BH2-1 may extend lengthwise in the second direction DR2. The first auxiliary barrier BH2-1 may be disposed between the portion LOa-1 of the seating area LOa (refer to FIG. 2) overlapping the fingerprint sensor area FRA (refer to FIG. 1A) and the opening OP when viewed in a plan view. The first auxiliary barrier BH2-1 may be disposed adjacent to the opening OP of the stage ST. The first auxiliary barrier BH2-1 may prevent the external light LL (refer to FIG. 2) incident to the opening OP from passing through the fingerprint sensor along the first direction DR1.

The second auxiliary barrier BH2-2 may extend lengthwise in the first direction DR1. For example, the second auxiliary barrier BH2-2 may extend away from the opening OP of the stage ST. The second auxiliary barrier BH2-2 may be adjacent to one side of the first auxiliary barrier BH2-1. The second auxiliary barrier BH2-2 may prevent the external light LL (refer to FIG. 2) incident to the opening OP from passing through the fingerprint sensor along the direction opposite to the second direction DR2.

The third auxiliary barrier BH2-3 may extend lengthwise in the first direction DR1. For example, the third auxiliary barrier BH2-3 may extend away from the opening OP of the stage ST. The third auxiliary barrier BH2-3 may be adjacent to the other side of the first auxiliary barrier BH2-1. The third auxiliary barrier BH2-3 may be spaced apart from the second auxiliary barrier BH2-2 with the portion LOa-1 of the seating area LOa (refer to FIG. 2) overlapping the fingerprint sensor area FRA (refer to FIG. 1A) and interposed therebetween. The third auxiliary barrier BH2-3 may space apart from the second auxiliary barrier BH2-2 in a direction in which the first auxiliary barrier BH2-1 extends. The third auxiliary barrier BH2-3 may face the second auxiliary barrier BH2-2 in the second direction DR2. The third auxiliary barrier BH2-3 may prevent the external light LL (refer to FIG. 2) incident to the opening OP from passing through the fingerprint sensor along the second direction DR2.

The fourth auxiliary barrier BH2-4 may extend lengthwise in the second direction DR2. The fourth auxiliary barrier BH2-4 may be spaced apart from the first auxiliary barrier BH2-1 with the portion LOa-1 of the seating area LOa (refer to FIG. 2) overlapping the fingerprint sensor area FRA (refer to FIG. 1A). The fourth auxiliary barrier BH2-4 may space apart from the first auxiliary barrier BH2-1 in a direction in which the second auxiliary barrier BH2-2 and the third auxiliary barrier BH2-3 extend. The fourth auxiliary barrier BH2-4 may face the first auxiliary barrier BH2-1 in the first direction DR1.

As shown in FIG. 5, the second and third auxiliary barriers BH2-2 and BH2-3 may be connected to one side and the other side of the first auxiliary barrier BH2-1, respectively. Accordingly, the first, second, and third auxiliary barriers BH2-1, BH2-2, and BH2-3 may be disposed to surround three sides of the portion LOa-1 of the seating area LOa (refer to FIG. 2) overlapping the fingerprint sensor area FRA (refer to FIG. 1A).

As shown in FIG. 6, the first, second, third, and fourth auxiliary barriers BH2-1, BH2-2, BH2-3, and BH2-4 may be connected to each other to form a closed line CC in a plane. The closed line CC formed by the second barrier BH2 may overlap the fingerprint sensor area FRA (refer to FIG. 1A) of the display panel DP when viewed in a plane.

The auxiliary barriers BH2-1, BH2-2, BH2-3, and BH2-4 may be integrally formed with each other. Accordingly, the auxiliary barriers BH2-1, BH2-2, BH2-3, and BH2-4 may have a single frame shape, however, they should not be limited thereto or thereby. As another way, the auxiliary barriers BH2-1, BH2-2, BH2-3, and BH2-4 may be spaced apart from each other or only some of them may be connected to each other.

In FIGS. 5 and 6, the auxiliary barriers BH2-1, BH2-2, BH2-3, and BH2-4 have the same width as each other in a plane, however, they should not be limited thereto or thereby. As another way, some of the auxiliary barriers BH2-1, BH2-2, BH2-3, and BH2-4 may have the same width as each other or all of the auxiliary barriers BH2-1, BH2-2, BH2-3, and BH2-4 may have different widths from each other.

The second barrier BH2 may block the external light incident to the fingerprint sensor of the display panel DP (refer to FIG. 1A) together with the first barrier BH1. In particular, the second barrier BH2 may prevent the external light incident to the opening OP from passing through the fingerprint sensor.

The first barrier BH1 and the second barrier BH2 may complement each other according to their shape and may prevent the external light from entering. For example, the first barrier BH1 may have a shape surrounding three sides of the seating area LOa as shown in FIG. 4. In this case, the second barrier BH2 may be disposed in a direction substantially parallel to a side surface that is not covered by the first barrier BH1 adjacent to the portion LOa-1 of the seating area LOa (refer to FIG. 2) overlapping the fingerprint sensor area FRA (refer to FIG. 1A). That is, the second auxiliary barrier BH2-2 of FIG. 5 may be disposed to complement the first barrier BH1 of FIG. 4. Accordingly, the external light incident to the side surface on which no first barrier BH1 is disposed may be blocked by the second barrier BH2.

The first, second, third, and fourth auxiliary barriers BH2-1, BH2-2, BH2-3, and BH2-4 may be disposed to be spaced apart from and parallel to the second, fourth, first, and third sub-barriers BH1-2, BH1-4, BH1-1, and BH1-3, respectively. As the jig JG of the present disclosure includes the first barrier BH1 and the second barrier BH2, the entrance of the external light may be effectively prevented in the inspection process of the display panel DP. The jig JG of the present disclosure may provide the environment similar to the dark room in the inspection process of the fingerprint sensor, and thus, the noise of the inspection result value may be reduced.

Figure 7:
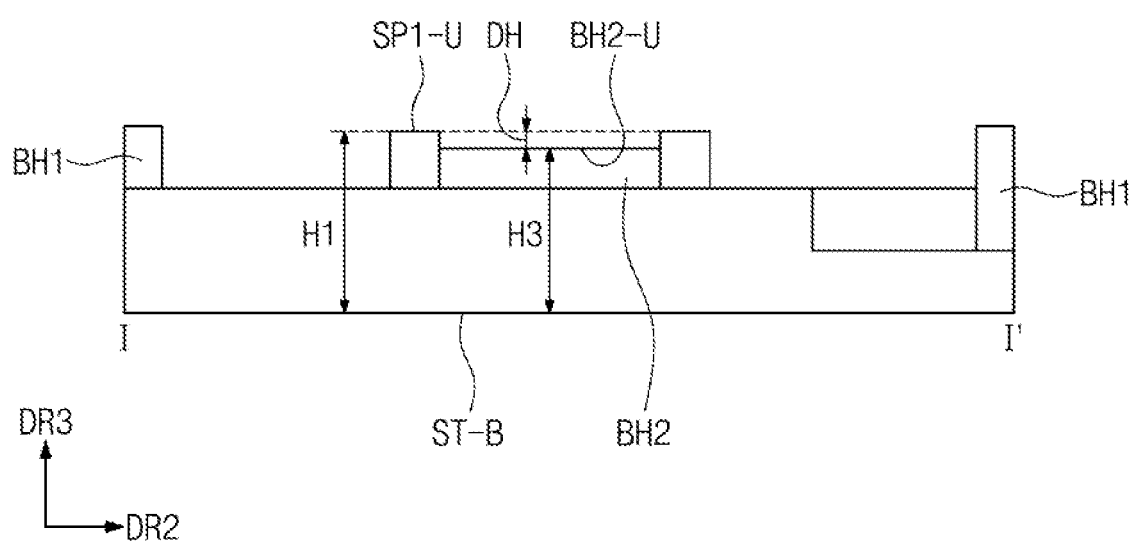
FIG. 7 is a cross-sectional view taken along a line I-I' shown in FIG. 6 to show a jig for an inspection of a display panel according to an embodiment of the present disclosure.
Figure 8:
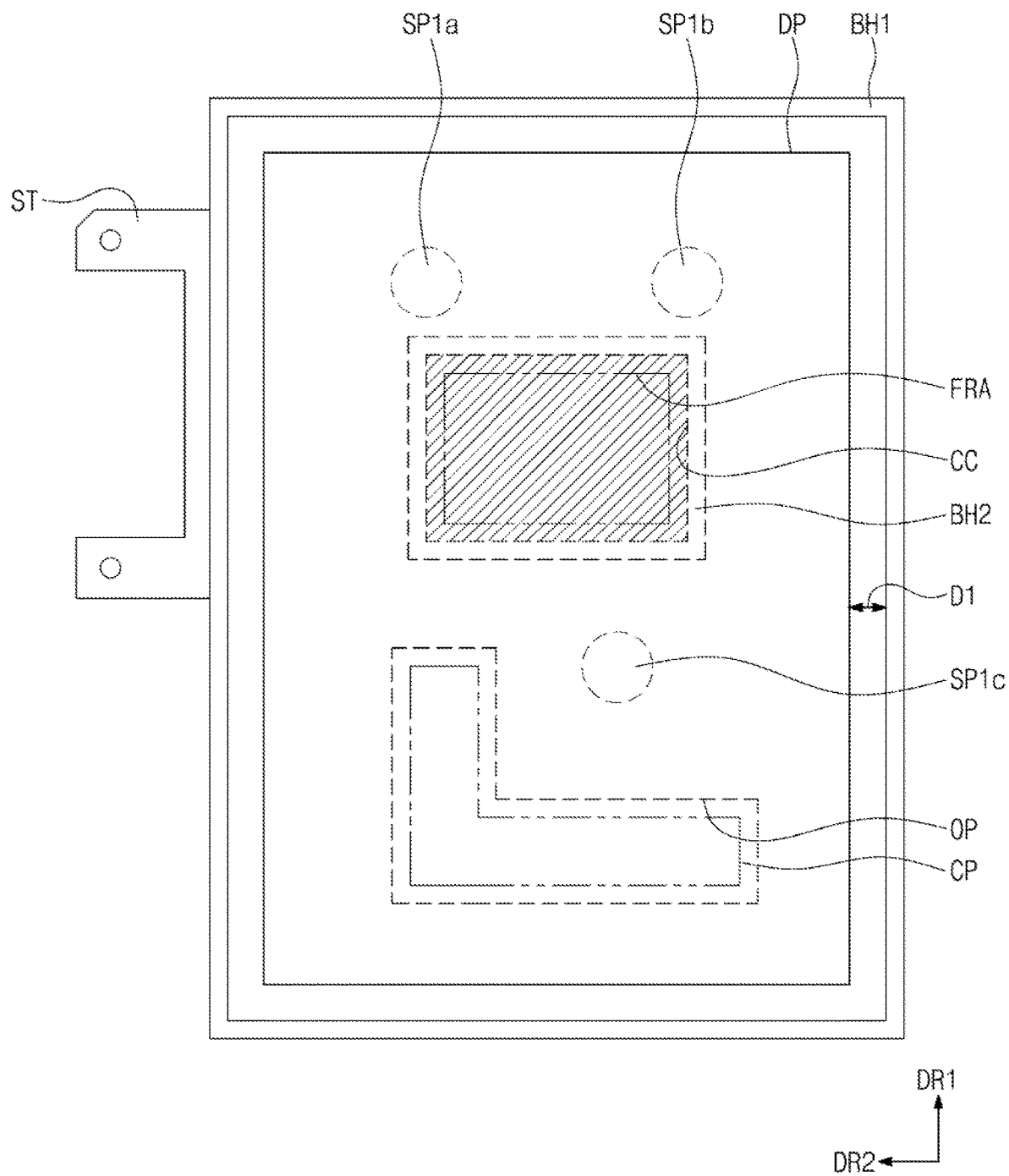
FIG. 8 is a plan view showing a display panel inspection jig, which is provided with a display panel placed thereon according to an embodiment of the present disclosure.

FIG. 7 is a cross-sectional view taken along line I-I' shown in FIG. 6. FIG. 8 is a plan view showing the display panel disposed on the jig shown in FIG. 6.

Referring to FIG. 7, a height between the lower surface ST-B of the stage ST and the upper surface SP1-U of the first supporter SP1 may be referred to as a first height H1. A height between the lower surface ST-B of the stage ST and an upper surface BH2-U of the second barrier BH2 may be referred to as a third height H3. The third height H3 may be equal to or smaller than the first height H1. When viewed in a side view, the separation space defined by the lower surface of the display panel DP and the upper surface ST-U of the stage ST may be covered by second barrier BH2 by the height of the second barrier BH2.

When the third height H3 is equal to the first height H1, the upper surface BH2-U of the second barrier BH2 may be in contact with the lower surface of the display panel DP. The upper surface BH2-U of the second barrier BH2 may include a material that prevents the display panel DP from being damaged.

When the third height H3 is smaller than the first height H1, there is a difference in height between the upper surface SP1-U of the first supporter SP1 and the upper surface BH-U of the second barrier BH2 by a first distance DH. As the first distance DH decreases, the separation space between the lower surface of the display panel DP and the fingerprint sensor area FRA of the jig JG (refer to FIG. 1A) may be more effectively covered when viewed in a side view. For example, the first distance DH may be equal to or smaller than about 0.2 mm, however, the first distance DH should not be limited thereto or thereby.

Referring to FIG. 8, the opening OP defined in the stage ST may overlap the circuit board area CP of the display panel DP when viewed in a plan view, however, it should not be limited thereto or thereby. As another way, a portion or all the circuit board area CP may overlap the opening OP depending on the shape of the opening OP.

When viewed in a plan view, the first barrier BH1 may be spaced apart from the display panel DP disposed on the stage ST by a predetermined separation distance D1. As the separation distance D1 decreases, the entrance of the external light may be effectively prevented. For example, the separation distance D1 may be equal to or smaller than about 3 mm, however, the separation distance D1 should not be limited thereto or thereby.

When viewed in a plan view, the second barrier BH2 may form a closed line CC. The closed line CC may enclose the fingerprint sensor area FRA of the display panel DP and extending along the outer boundary of the fingerprint sensor area FRA. When viewed in a plan view, the closed line CC may be spaced apart from the first supporter SP1 and the opening OP, which may exert influences on the inspection of the fingerprint sensor. Accordingly, the external light incident to the lower surface of the stage ST may be effectively by the second barrier BH2 forming the closed line CC.

When viewed in a plan view, the closed line CC may have an enclosed area that is equal to or greater than an area of the fingerprint sensor area FRA. The second barrier BH2 may block the external light passing through the separation space by enclosing the fingerprint sensor area FRA between the display panel DP and the stage ST, and the second barrier BH2 may reduce the noise on the result value of the inspection of the fingerprint sensor.

The second barrier BH2 described with reference to FIGS. 5 to 8 may be integrally formed with the stage ST. The second barrier BH2 may include the same material as that of the stage ST, however, it should not be limited thereto or thereby. The second barrier BH2 may be separated from the stage ST and may include a different material from that of the stage ST.

Figure 10A:
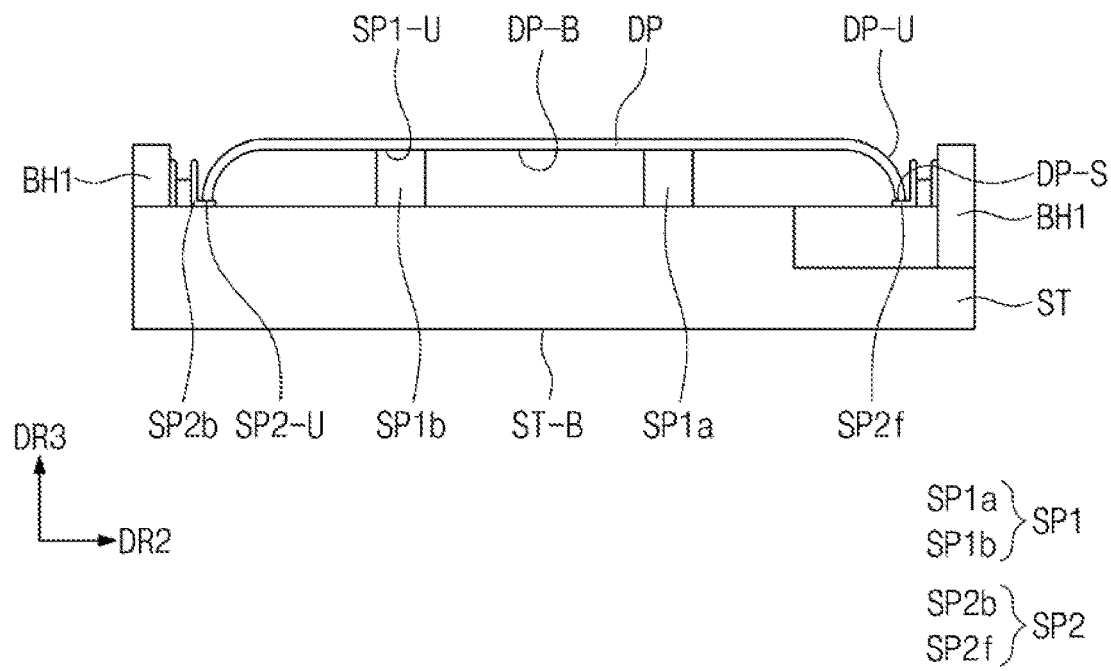
FIG. 10A is a cross-sectional view showing a display panel inspection jig, which is provided with a display panel placed thereon according to an embodiment of the present disclosure.
Figure 10B:
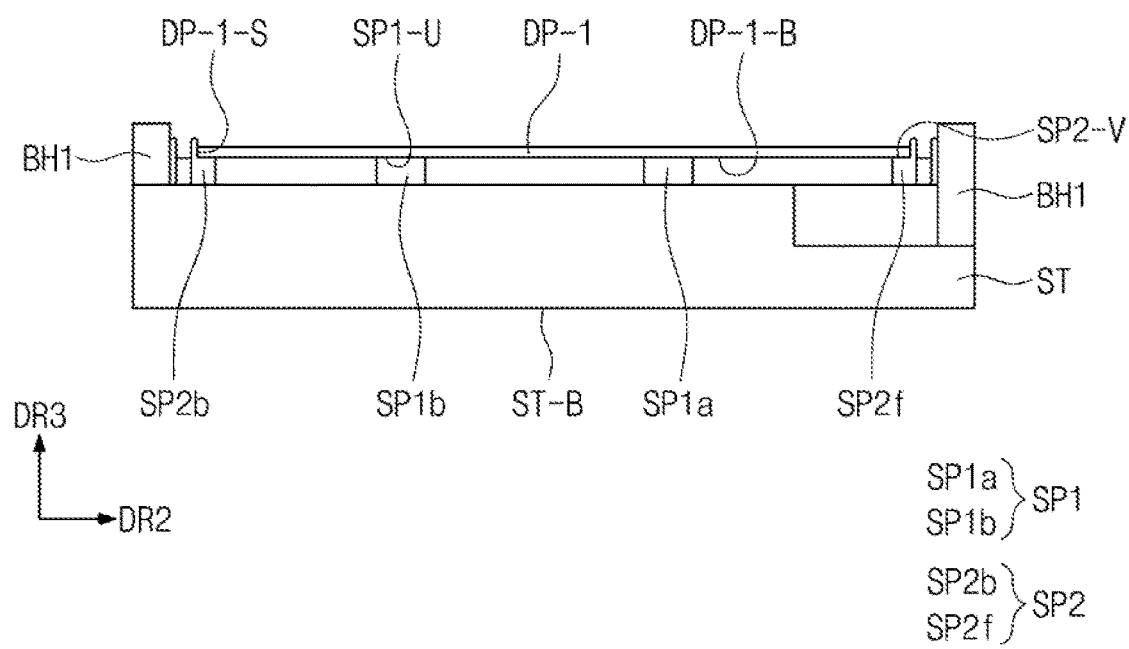
FIG. 10B is a cross-sectional view showing a display panel inspection jig, which is provided with a display panel placed thereon according to an embodiment of the present disclosure.

FIGS. 9, 10A, and 10B are views showing a display panel inspection jig JG according to an embodiment of the present disclosure. The jig JG shown in FIGS. 9, 10A, and 10B include substantially the same configurations as those of the jig described with reference to FIGS. 1A to 4 except some components. Hereinafter, in FIGS. 9, 10A, and 10B, different features of the jig JG from those of the jig shown in FIGS. 1A to 4 will be mainly described.

FIG. 9 is a perspective view showing the jig JG. The jig JG of the present disclosure may include a second supporter SP2.

The second supporter SP2 may be disposed on the stage ST to overlap the seating area LOa. The second supporter SP2 may include a plurality of supporters SP2a, SP2b, SP2c, SP2d, SP2e, and SP2f that supports the display panel DP as shown in FIG. 9. The supporters SP2a, SP2b, SP2c, SP2d, SP2e, and SP2f may be spaced apart from each other and may be disposed in the seating area LOa adjacent to the peripheral area NLOa.

The second supporter SP2 may be spaced apart from the first supporter SP1. Each of supporters SP2a, SP2b, SP2c, SP2d, SP2e, and SP2f of the second supporter SP2 may be spaced apart from the first supporter SP1. The first supporter SP1 may support the lower surface of the display panel DP, and the second supporter SP2 may prevent the display panel DP from shaking in the first direction DR1 or the second direction DR2.

The second supporter SP2 may be disposed to be substantially parallel to the first barrier BH1. Referring to FIG. 9, each of the supporters SP2a, SP2b, SP2c, SP2d, SP2e, and SP2f may be disposed to be parallel to the first barrier BH1.

However, the second supporter SP2 should not be limited thereto or thereby, and the second supporter SP2 may be implemented as one supporter that supports the lower surface or the side surface of the display panel DP, and the one supporter may be disposed to be parallel to the first barrier BH1.

The second supporter SP2 may include a plastic or metal material. In addition, the second supporter SP2 may be in contact with the display panel DP, and the second supporter SP2 may include an elastic material such as rubber to prevent the display panel DP from being damaged. The second supporter SP2 may be formed of a variety of materials having a strength enough to support the display panel DP, without being limited to a particular material.

FIGS. 10A and 10B are cross-sectional views showing a display panel inspection jig, which is provided with a display panel placed thereon according to an embodiment. FIGS. 10A and 10B show display panels DP and DP-1 having different shapes from each other and disposed on the jig JG.

The display panel may have a curved shape or a flat shape. The second supporter SP2 may support the lower surface or the side surface of the display panel depending on the shape of the display panel supported by the second supporter SP2. According to the shape of the display panel, a height of each of the first supporter SP1 and the second supporter SP2 may be changed.

FIG. 10A is a cross-sectional view showing the display panel DP having the curved shape and disposed on the jig JG. A portion DP-U of an upper surface of the display panel DP may be curved, and a normal line direction of the portion DP-U of the upper surface may be a direction between the third direction DR3 and the second direction DR2. The supporters SP2b and SP2f of the second supporter SP2 may support a side surface DP-S of the display panel DP. The supporters SP2b and SP2f of the second supporter SP2 may include a surface that supports the portion DP-U of the upper surface of the curved display panel DP.

When viewed in a side view, a height of the upper surface SP1-U of the first supporters SP1 that support a lower surface DP-B of the display panel DP may be greater than a height of the upper surface SP2-U of the second supporter SP2 that supports the side surface DP-S of the display panel DP.

FIG. 10B is a cross-sectional view showing the display panel DP-1 having the flat shape and disposed on the jig JG. The supporters SP2b and SP2f of the second supporter SP2 may support a portion of a lower surface DP-1-B of the display panel DP-1. The supporters SP1a and SP1b of the first supporter SP1 may support the lower surface DP-1-B of the display panel DP-1, which is near to a center of the display panel DP-1, and the supporters SP2b and SP2f of the second supporter SP2 may support the lower surface DP-1-B of the display panel DP-1, which is near to a periphery of the display panel DP-1. The supporters SP2b and SP2f of the second supporter SP2 may include a surface that supports a side surface DP-1-S of the display panel DP-1.

When viewed in a side view, a height of the upper surface SP1-U of the first supporters SP1 that support the lower surface DP-1-B of the display panel DP-1 may be the same as a height of the upper surface SP2-V of the second supporters SP2 that support the lower surface DP-1-B of the display panel DP-1.

Figure 11:
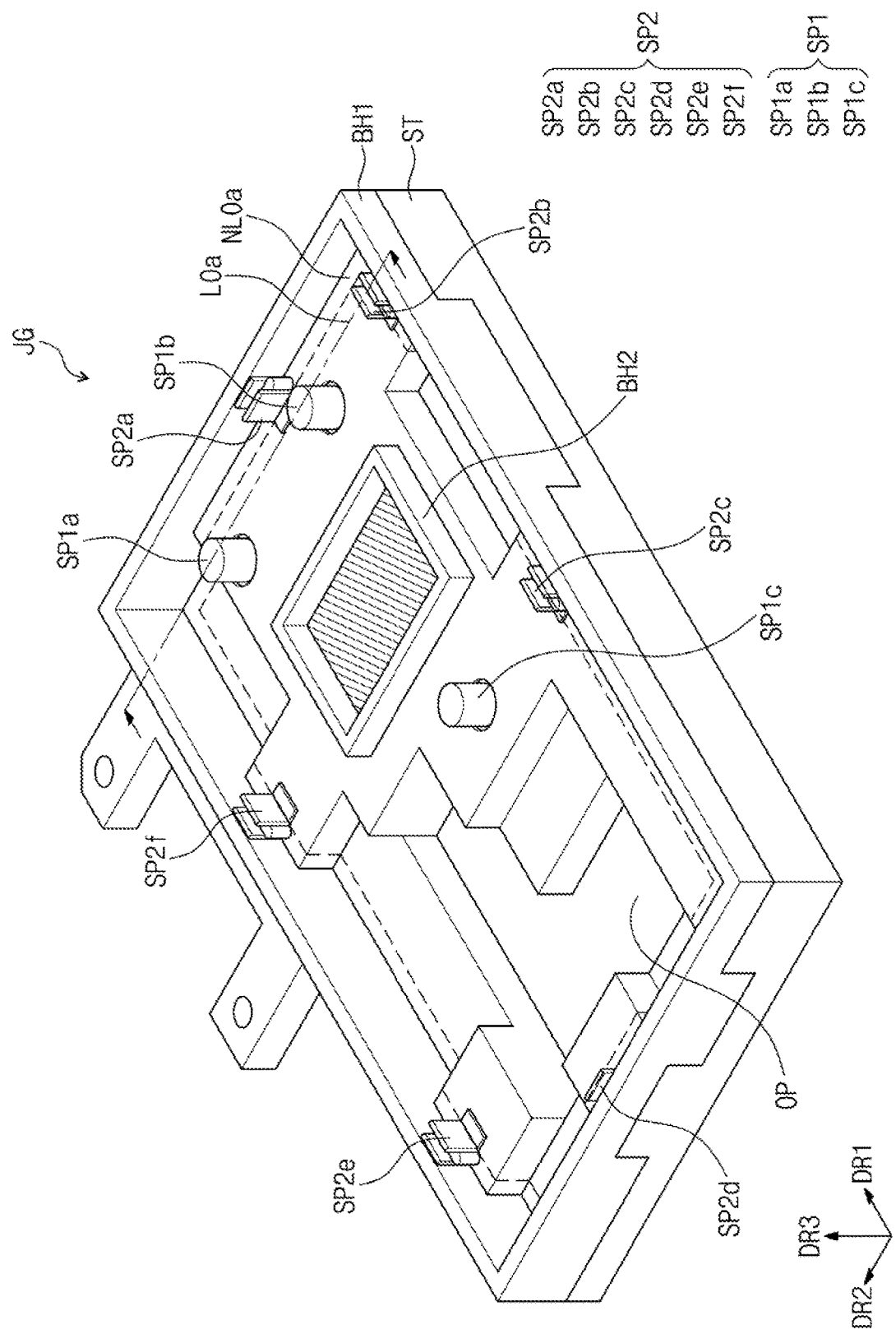
FIG. 11 is a perspective view showing a jig for an inspection of a display panel according to an embodiment of the present disclosure.

FIG. 11 is a perspective view showing a display panel inspection jig JG according to an embodiment of the present disclosure. Referring to FIG. 11, the jig JG may include a stage ST, a first supporter SP1, a second supporter SP2, a first barrier BH1, and a second barrier BH2. Descriptions of the components of FIGS. 1A to 10B may be applied to components of FIG. 11.

The first supporter SP1 may support a lower surface of a display panel, and the second supporter SP2 may support edge of the display panel to prevent the display panel from shaking in left and right directions.

The first barrier BH1 may block the external light incident to the display panel DP disposed on the stage ST from the outside. The first barrier BH1 may include a lower surface having a shape corresponding to a shape of an upper surface of the stage ST, and the first barrier BH1 may have a thickness that varies depending on its position.

The second barrier BH2 may surround a portion LOa-1 of the seating area LOa (refer to FIG. 2) enclosing a fingerprint sensor area FRA (refer to FIG. 1A). The second barrier BH2 may cover a separation space defined between the display panel DP and the stage ST and enclosing the fingerprint sensor area FRA (refer to FIG. 1A), and thus, may block the external light incident to the fingerprint sensor.

Figure 12A:
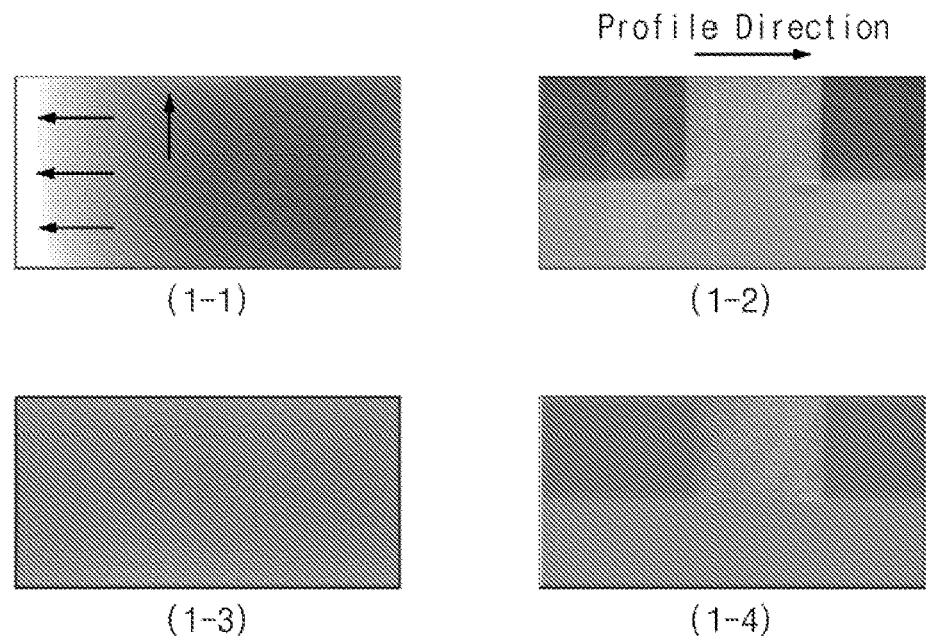
FIG. 12A shows images obtained from a fingerprint sensor of a display panel according to an embodiment of the present disclosure.
Figure 12B:
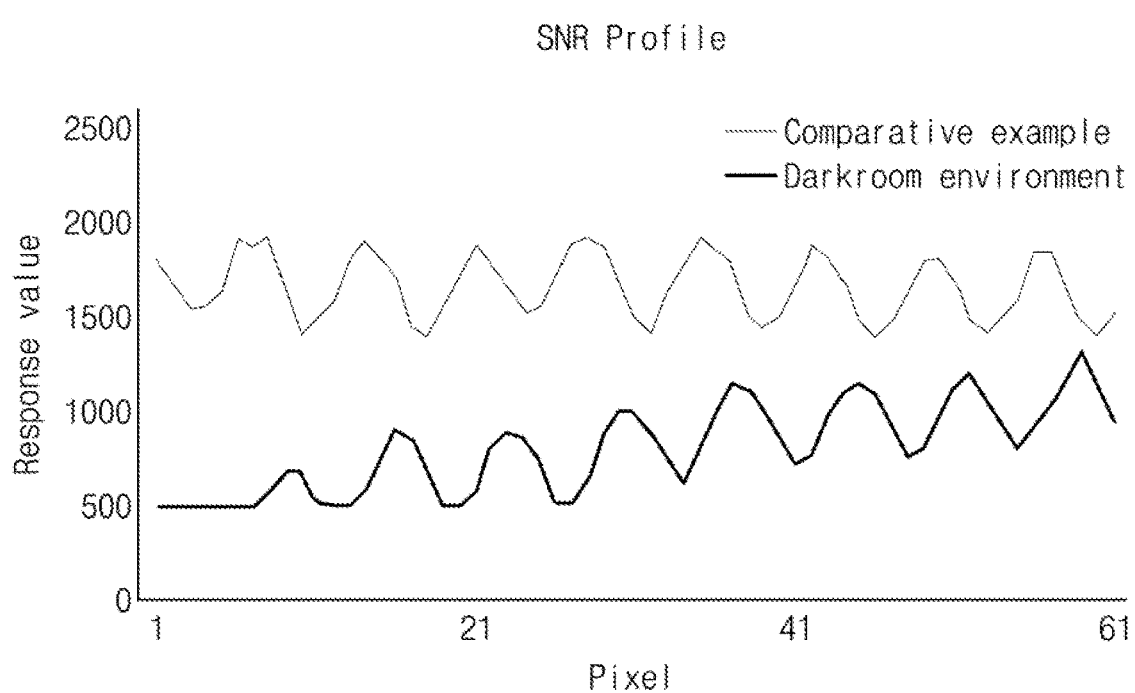
FIG. 12B shows an SNR profile according to an inspection of a fingerprint sensor of a display panel according to an embodiment of the present disclosure.
Figure 12C:
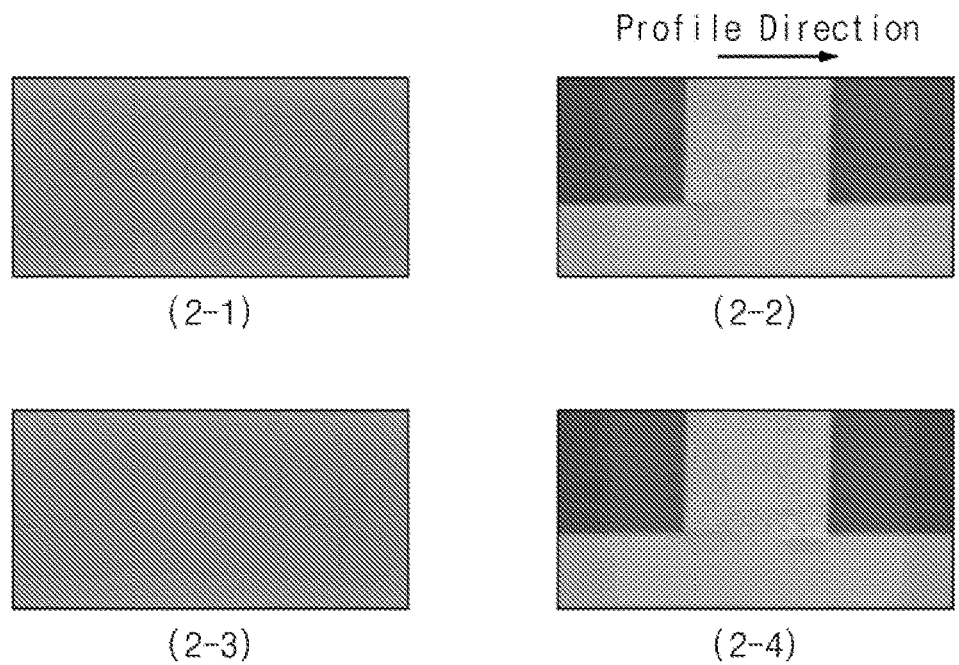
FIG. 12C shows images obtained from a fingerprint sensor of a display panel according to an embodiment of the present disclosure.
Figure 12D:
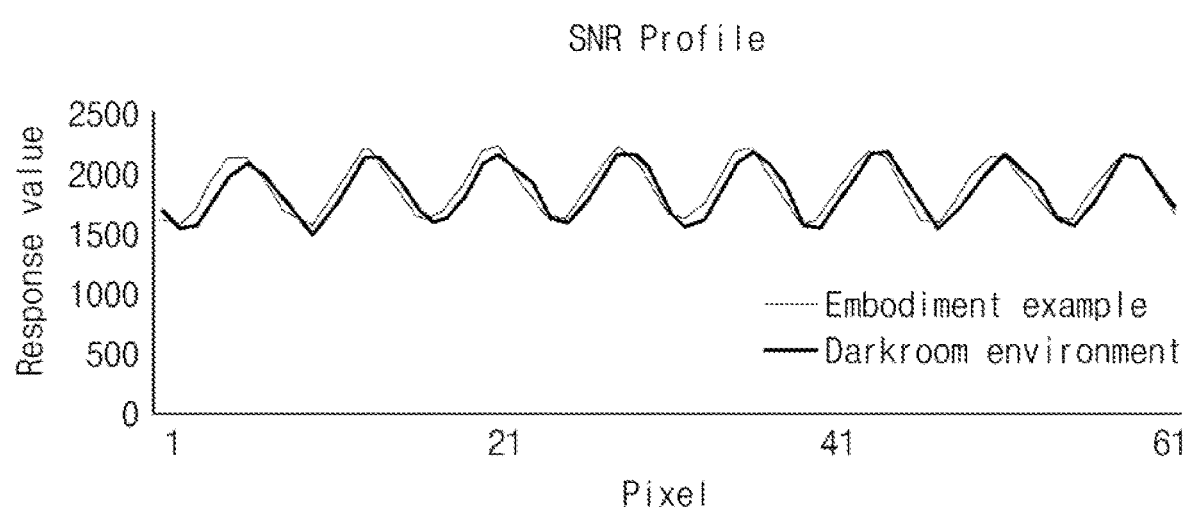
FIG. 12D shows an SNR profile according to an inspection of a fingerprint sensor of a display panel according to an embodiment of the present disclosure.

FIG. 12A shows images obtained from a fingerprint sensor of a display panel disposed in a darkroom environment and images obtained from a fingerprint sensor of a display panel disposed on a jig of a comparative example. FIG. 12B shows an SNR profile graph of the fingerprint sensor measured from the display panel disposed on the jig of the comparative example and an SNR profile graph of the fingerprint sensor of the display panel, which is measured in the darkroom environment. FIG. 12C shows images obtained from a fingerprint sensor of a display panel disposed in a darkroom environment and images obtained from a fingerprint sensor of a display panel disposed on a jig of an embodiment example. FIG. 12D shows an SNR profile graph of the fingerprint sensor measured from the display panel disposed on the jig of the embodiment example and an SNR profile graph of the display panel, which is measured in the darkroom environment.

The jig according to the embodiment example includes the components of the jig JG shown in FIG. 11. The Jig of the comparative example does not include the first barrier BH1 and the second barrier BH2 among the components of the jig JG shown in FIG. 11.

Images (1-1), (1-3), (2-1), and (2-3) shown in FIGS. 12A and 12C are dark images photographed by the fingerprint sensor. Images (1-2), (1-4), (2-2), and (2-4) shown in FIGS. 12A and 12C are SNR (signal to noise ratio) images photographed by the fingerprint sensor. The dark images indicate images obtained by the fingerprint sensor under a dark condition. The SNR image indicates a fingerprint pattern that is photographed by the fingerprint sensor to measure an SNR index.

Referring to FIG. 12A, the image (1-1) is the dark image obtained by the fingerprint sensor after the display panel is disposed on the jig of the comparative example. The image (1-3) is the dark image obtained by the fingerprint sensor of the display panel in the darkroom environment. The image (1-2) is the SNR image obtained by the fingerprint sensor after the display panel is disposed on the jig of the comparative example. The image (1-4) is the SNR image obtained by the fingerprint sensor of the display panel in the darkroom environment.

When comparing the image (1-1) with the image (1-3), it is observed that some areas are brightened in a direction of an arrow shown in the image (1-1). This is because the fingerprint sensor is influenced by the external light when the dark image is obtained. When comparing the image (1-2) with the image (1-4), it is observed that there is a difference in brightness between the images due to the influence of the external light.

Accordingly, the brightness difference exists between the image photographed by the fingerprint sensor of the display panel disposed on the jig of the comparative example and the image photographed by the fingerprint sensor of the display panel in darkroom environment due to the external light. This brightness difference causes the noise on the result value of the inspection of the fingerprint sensor.

Referring to FIG. 12C, the image (2-1) is the dark image obtained by the fingerprint sensor after the display panel is disposed on the jig of the embodiment example. The image (2-3) is the dark image obtained by the fingerprint sensor of the display panel in the darkroom environment. The image (2-2) is the SNR image obtained by the fingerprint sensor after the display panel is disposed on the jig of the embodiment example. The image (2-4) is the SNR image obtained by the fingerprint sensor of the display panel in the darkroom environment.

When comparing the image (2-1) with the image (2-3), it is observed that the dark image obtained in the darkroom environment is almost similar to the dark image obtained after the display panel is disposed on the jig of the embodiment example. In addition, when comparing the image (2-2) with the image (2-4), it is observed that the SNR images have similar brightness. This is because the external light incident to the fingerprint sensor of the display panel is blocked by the jig including the first barrier and the second barrier according to the embodiment example. Accordingly, it is observed that the inspection of the fingerprint sensor of the display panel in the jig of the embodiment example brings almost the same results as the inspection of the fingerprint sensor of the display panel in the darkroom environment.

The SNR index according to a profile direction may be measured using the SNR image obtained by the fingerprint sensor. The SNR index means a brightness difference value in each pixel according to the fingerprint pattern. The SNR profile shown in FIGS. 12B and 12D corresponds to a graph of a response value of the SNR index according to the pixel.

Referring to FIG. 12B, it is observed that the response value of the SNR of the fingerprint sensor of the display panel inspected in the jig of the comparative example is smaller than the response value of the SNR of the fingerprint sensor inspected in the darkroom environment. This is because the fingerprint sensor of the display panel disposed on the jig of the comparative example is influenced by the external light.

Referring to FIG. 12D, the response value of the SNR of the fingerprint sensor of the display panel inspected in the jig of the embodiment example is substantially the same as the response value of the SNR of the fingerprint sensor of the display panel inspected in the darkroom environment. This is because the first and second barriers included in the jig of the embodiment example block the external light from entering in the inspection process of the fingerprint sensor and provide the inspection environment similar to the darkroom environment.

As the display panel inspection jig of the present disclosure includes the barrier, the external light may be blocked during the driving inspection of the display panel, and the noise on the inspection result may be removed. In particular, the display panel inspection jig of the present disclosure may provide the environment similar to the dark room in the inspection process of the optical fingerprint sensor of the display panel and may remove the noise in the calibration process of the phase of the optical fingerprint sensor. As the display panel is inspected on the display panel inspection jig of the present disclosure, a separate process is not needed to form the darkroom environment, and thus, the display panel inspection jig of the present disclosure may reduce a process cost.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims.

What is claimed is:

1. A display panel inspection jig comprising:
a stage comprising a seating area in which a display panel is to be disposed for inspection thereof, and a peripheral area surrounding the seating area, and comprising an uneven upper surface and a lower surface, wherein the seating area of the stage is provided with an opening extending from the uneven upper surface of the stage to the lower surface thereof;
a first supporter disposed on a first portion of the uneven upper surface of the stage, wherein the first portion of the uneven upper surface is at the seating area and spaced apart from the opening; and
a first barrier disposed on a second portion of the uneven upper surface of the stage, wherein the second portion of the uneven upper surface is at the peripheral area, wherein the first barrier has an uneven lower surface such that the uneven lower surface of the first barrier and the uneven upper surface of the stage are fitted with each other.

2. The display panel inspection jig of claim 1,
wherein an upper surface of the first supporter is disposed at a first height from the lower surface of the stage,
wherein an upper surface of the first barrier is disposed at a second height from the lower surface of the stage, and the second height is equal to or greater than the first height, and
wherein the lower surface of the stage is flat.

3. The display panel inspection jig of claim 1,
wherein the first barrier has a height that varies along the peripheral area.

4. The display panel inspection jig of claim 1,
Wherein, when the display panel inspection jig is viewed in a plan view, the first barrier is spaced apart from the display panel disposed on the first supporter by a predetermined distance, and
wherein the predetermined distance is equal to or smaller than about 3 mm.

5. The display panel inspection jig of claim 1,
wherein the first barrier comprises:
a first sub-barrier extending lengthwise in a first direction;
a second sub-barrier extending lengthwise in a second direction, different from the first direction, and connected to a first end of the first sub-barrier; and
a third sub-barrier extending lengthwise in the second direction and connected to a second end of the first sub-barrier, and spaced apart from the second sub-barrier in the first direction.

6. The display panel inspection jig of claim 5,
wherein the first barrier further comprises:
a fourth sub-barrier extending lengthwise in the first direction and spaced apart from the first sub-barrier in the second direction, and
wherein the seating area is interposed between the first sub-barrier and the fourth sub-barrier.

7. The display panel inspection jig of claim 1,
wherein the first barrier is integrally formed with the stage.

8. The display panel inspection jig of claim 1, further comprising:
a second barrier disposed on a third portion of the uneven upper surface at the seating area of the stage,
wherein, when the display panel is viewed in a plan view, the second barrier is spaced apart from the first supporter and the first barrier.

9. The display panel inspection jig of claim 8,
wherein an upper surface of the first supporter is disposed at a first height from the lower surface of the stage,
wherein an upper surface of the second barrier is disposed at a second height from the lower surface of the stage,
wherein the second height is equal to or smaller than the first height, and
wherein the lower surface of the stage is flat.

10. The display panel inspection jig of claim 9,
wherein a difference between the first height and the second height is equal to or smaller than about 0.2 mm.

11. The display panel inspection jig of claim 8,
wherein the second barrier comprises:
a first auxiliary barrier disposed adjacent to the opening of the stage;
a second auxiliary barrier connected to a first end of the first auxiliary barrier and extending away from the opening of the stage; and
a third auxiliary barrier connected to a second end of the first auxiliary barrier and extending away from the opening of the stage, and
wherein the second auxiliary barrier and the third auxiliary barrier are spaced apart from each other in a direction in which the first auxiliary barrier extends.

12. The display panel inspection jig of claim 11,
wherein the second barrier further comprises:
a fourth auxiliary barrier spaced apart from the first auxiliary barrier in the direction in which each of the second auxiliary barrier and the third auxiliary barrier extends away from the opening of the stage, and
wherein the second auxiliary barrier is connected to a first end of the fourth auxiliary barrier, and the third auxiliary barrier is connected to a second end of the fourth auxiliary barrier.

13. The display panel inspection jig of claim 8,
wherein, when the display panel inspection jig is viewed in a plan view, the second barrier is spaced apart from the opening and forms a closed line.

14. The display panel inspection jig of claim 8,
wherein the second barrier is integrally formed with the stage.

15. The display panel inspection jig of claim 1, further comprising:
a second supporter disposed in the seating area of the stage and supporting the display panel,
wherein the second supporter is adjacent to a corresponding portion of the first barrier, and
wherein the second support extends parallel to a direction in which the corresponding portion of the first barrier extends.

16. The display panel inspection jig of claim 15,
wherein the second supporter supports a side surface or a lower surface of the display panel.

17. A display panel inspection jig comprising:
a stage comprising a seating area in which a display panel is to be disposed in inspection thereof and a peripheral area surrounding the seating area, wherein the seating area of the stage is provided with an opening defined therethrough;

a first supporter disposed on the seating area of the stage and supporting a lower surface of the display panel, wherein the first supporter is separated from the peripheral area of the stage and extends upwardly from an upper surface of the stage within the opening of the seating area;

a second supporter disposed on the seating area of the stage, spaced apart from the first supporter, and supporting an edge of the display panel; and a first barrier disposed on the peripheral area of the stage and surrounding an entire area of the seating area.

18. The display panel inspection jig of claim 17, further comprising:

a second barrier disposed in the seating area, spaced apart from the opening of the stage, and forming, when the display panel inspection jig is viewed in a plan view, a closed line.

19. The display panel inspection jig of claim 18, wherein, when the display panel inspection jig is viewed in the plan view, the closed line is spaced apart from the first supporter.

20. The display panel inspection jig of claim 18, wherein the second barrier is adjacent to a corresponding portion of the first barrier, and wherein the second barrier extends parallel to a direction in which the corresponding portion of the first barrier extends.

* * * * *